US011568296B2

(12) United States Patent
Shao et al.

(10) Patent No.: US 11,568,296 B2
(45) Date of Patent: Jan. 31, 2023

(54) HIGHWAY JUMPER TO ENABLE LONG RANGE CONNECTIVITY FOR SUPERCONDUCTING QUANTUM COMPUTER CHIP

(71) Applicant: INTERNATIONAL BUSINESS MACHINES CORPORATION, Armonk, NY (US)

(72) Inventors: Dongbing Shao, Wappingers Falls, NY (US); Markus Brink, White Plains, NY (US); Martin O. Sandberg, Ossining, NY (US); Vivekananda P. Adiga, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 468 days.

(21) Appl. No.: 16/711,064

(22) Filed: Dec. 11, 2019

(65) Prior Publication Data
US 2021/0183793 A1 Jun. 17, 2021

(51) Int. Cl.
*G06N 10/00* (2022.01)
*G06N 10/40* (2022.01)
*H01L 23/498* (2006.01)
*H01L 23/64* (2006.01)
*H01L 27/18* (2006.01)

(52) U.S. Cl.
CPC ............. *G06N 10/00* (2019.01); *G06N 10/40* (2022.01); *H01L 23/49838* (2013.01); *H01L 23/645* (2013.01); *H01L 27/18* (2013.01)

(58) Field of Classification Search
None
See application file for complete search history.

(56) References Cited

U.S. PATENT DOCUMENTS

| 7,613,765 | B1 | 11/2009 | Hilton et al. |
| 8,164,082 | B2 | 4/2012 | Friesen |
| 9,663,358 | B1 | 5/2017 | Cory et al. |
| 10,268,622 | B2 | 4/2019 | Hilton et al. |

(Continued)

FOREIGN PATENT DOCUMENTS

| WO | 2018169585 A1 | 9/2018 |
| WO | 2018/212041 A1 | 11/2018 |

OTHER PUBLICATIONS

Lloyd, "Quantum approximate optimization is computationall universal", arXiv:1812.11075v1 [quant-ph] Dec. 28, 2018, pp. 1-6.

(Continued)

*Primary Examiner* — Ernest Unelus
*Assistant Examiner* — Dayton Lewis-Taylor
(74) *Attorney, Agent, or Firm* — Amin, Turocy & Watson, LLP

(57) ABSTRACT

According to an embodiment of the present invention, a quantum processor includes a qubit chip. The qubit chip includes a substrate, and a plurality of qubits formed on a first surface of the substrate. The plurality of qubits are arranged in a pattern, wherein nearest-neighbor qubits in the pattern are connected. The quantum processor also includes a long-range connector configured to connect a first qubit of the plurality of qubits to a second qubit of the plurality of qubits, wherein the first and second qubits are separated by at least a third qubit in the pattern.

24 Claims, 12 Drawing Sheets

(56) References Cited

U.S. PATENT DOCUMENTS

| | | |
|---|---|---|
| 2009/0321720 A1 | 12/2009 | Rose |
| 2010/0241780 A1 | 9/2010 | Friesen |
| 2017/0220510 A1 | 8/2017 | Hilton et al. |
| 2018/0013052 A1 | 1/2018 | Oliver et al. |
| 2018/0218279 A1 | 8/2018 | Lechner et al. |
| 2018/0226451 A1 | 8/2018 | Dzurak et al. |
| 2018/0336153 A1 | 11/2018 | Naaman et al. |
| 2019/0042964 A1 | 2/2019 | Elsherbini et al. |
| 2021/0167271 A1* | 6/2021 | Hidaka ............ H01L 23/53285 |

OTHER PUBLICATIONS

Gushu Li et al.," Tankling the Qubit Mapping Problem for NISQ-Era Quantum Devices", Architectural Support for Programming Languages and Operating Systems, ACM, Apr. 4, 2019, pp. 1001-1014.

PCT/EP2020/084809 International Search Report completed Mar. 17, 2021.

PCT/EP2020/084809 Written Opinion completed Mar. 17, 2021.

\* cited by examiner

HIGHWAY JUMPER TO ENABLE LONG RANGE CONNECTIVITY FOR SUPERCONDUCTING QUANTUM COMPUTER CHIP

BACKGROUND

The currently claimed embodiments of the present invention relate to quantum computer chips, and more specifically, to a highway jumper to enable long range connectivity for superconducting quantum computer chips.

Superconducting quantum chips have limitations on qubit connectivity. Currently, superconducting quantum chip connectivity schemes are by "nearest neighbor." Each qubit in the quantum chip may be connected to a plurality of nearest neighbor qubits. However, the nearest neighbor qubits are likely only a small subset of the qubits included on the superconducting quantum chip. Thus, a given qubit is likely connected to the majority of the qubits on the quantum chip only through one or more additional qubits. If a two-qubit operation is desired in this case, a plurality of swap gates may be required to enable the operation. However, qubit state swapping adds operation overhead, which requires that the quantum system remain coherent for a longer period of time. Thus, systems and methods are needed to enable long-range connectively between qubits on a quantum chip.

SUMMARY

According to an embodiment of the present invention, a quantum processor includes a qubit chip. The qubit chip includes a substrate, and a plurality of qubits formed on a first surface of the substrate. The plurality of qubits are arranged in a pattern, wherein nearest-neighbor qubits in the pattern are connected. The quantum processor also includes a long-range connector configured to connect a first qubit of the plurality of qubits to a second qubit of the plurality of qubits, wherein the first and second qubits are separated by at least a third qubit in the pattern. The long-range connector enables two-qubit operations to be performed on non-nearest neighbor qubits on the qubit chip with a reduced number of swap gates. The long-range connector thus alleviates the operation overhead of two-qubit gates performed on non-nearest neighbor qubits.

According to an embodiment of the present invention, an interposer chip includes a substrate, a first coupling portion formed on the substrate, the first coupling portion positioned to align with a first qubit on a qubit chip, a second coupling portion formed on the substrate, the second coupling portion positioned to align with a second qubit on the qubit chip, and a bus formed on the substrate, the bus connecting the first coupling portion to the second coupling portion. The interposer chip is configured to be bonded to the qubit chip such that the first coupling portion couples to the first qubit and the second coupling portion couples to the second qubit. The interposer provides a long-range connection between qubits, enabling two-qubit gates to be performed on non-nearest neighbor qubits with reduced operation overhead.

According to an embodiment of the present invention, a method to enable long range connectivity of qubits on a qubit chip includes providing the qubit chip comprising a plurality of qubits arranged in a pattern, wherein nearest-neighbor qubits in the pattern are connected. The method further includes providing a long-range connector configured to connect a first qubit of the plurality of qubits to a second qubit of the plurality of qubits, wherein the first and second qubits are separated by at least a third qubit in the pattern. The method reduces the operation overhead of two-qubit gates acting on non-nearest neighbor qubits in the pattern.

DETAILED DESCRIPTION

Figure 1:
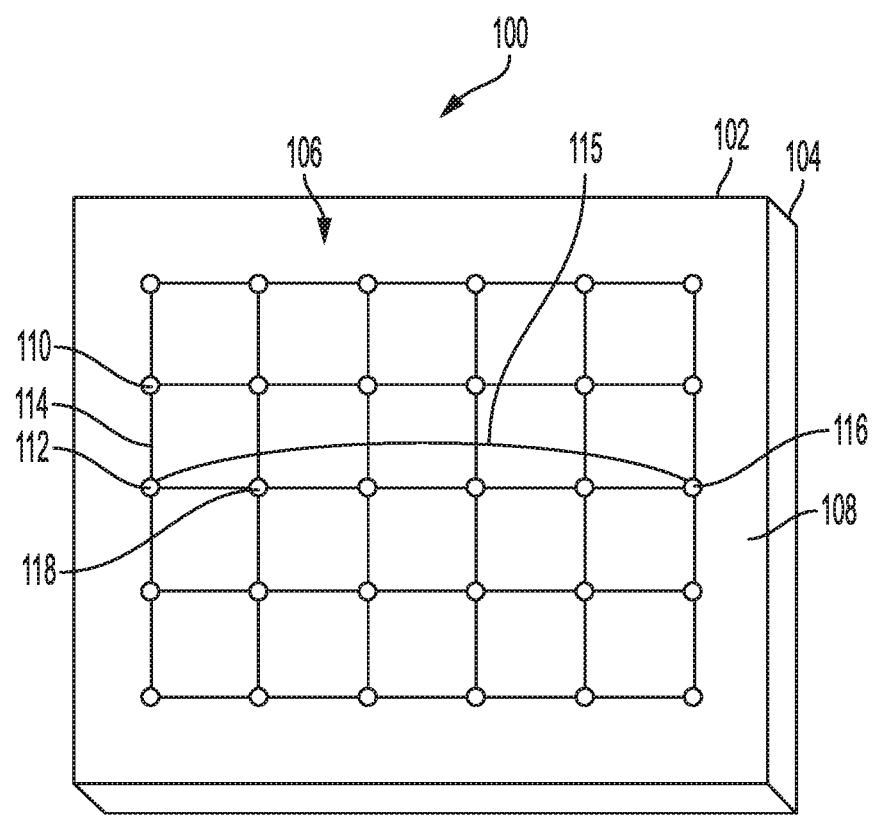
FIG. 1 is a schematic illustration of a quantum processor according to an embodiment of the present invention.

FIG. 1 is a schematic illustration of a quantum processor 100 according to an embodiment of the present invention. The quantum processor 100 includes a qubit chip 102. The qubit chip 102 includes a substrate 104 and a plurality of qubits 106 formed on a first surface 108 of the substrate 104. The plurality of qubits 106 are arranged in a pattern, wherein nearest-neighbor qubits in the pattern are connected. For example, nearest neighbor qubits 110, 112 are connected, as indicated by a line 114 connecting the nearest neighbor qubits 110, 112. The quantum processor 100 includes a long-range connector 115 configured to connect a first qubit 112 of the plurality of qubits 106 to a second qubit 116 of the plurality of qubits 106. The first and second qubits 112, 116 are separated by at least a third qubit 118 in the pattern.

Figure 2:
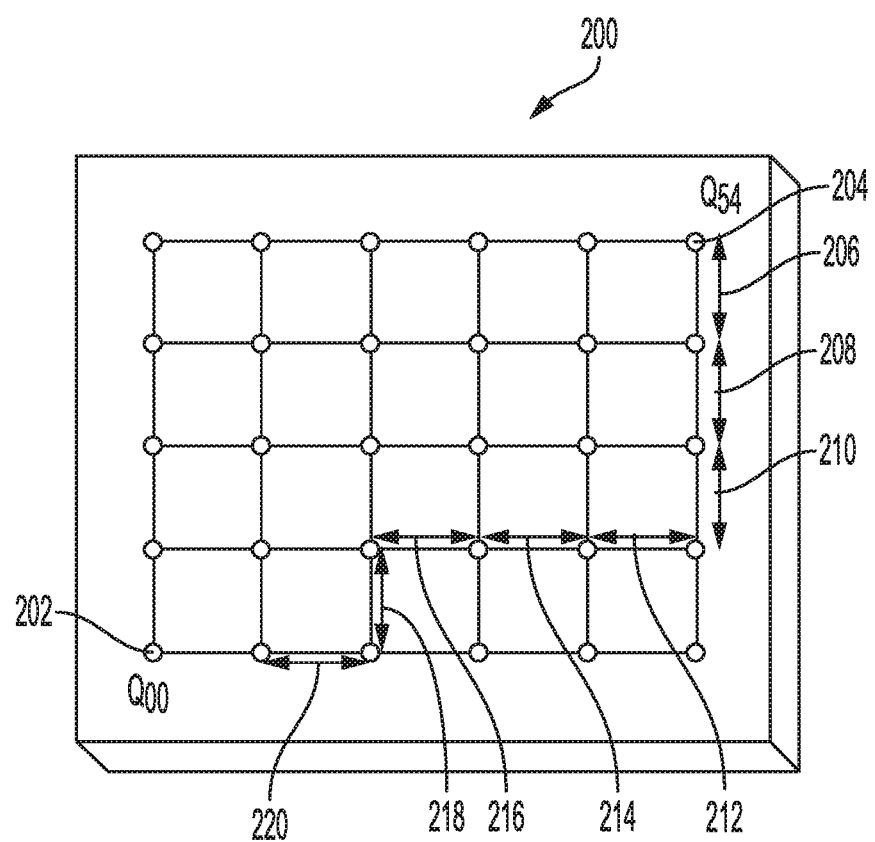
FIG. 2 is a schematic illustration of a quantum processor that includes 30 qubits connected in a grid to facilitate an explanation of some concepts of the present invention.

The long-range connector 115 reduces the number of swaps required to perform two-qubit gates on non-nearest neighbor qubits. FIG. 2 is a schematic illustration of a quantum processor 200 that includes 30 qubits connected in a grid. The grid connects nearest-neighbor qubits, but does not include connections between non-nearest neighbor qubits. Accordingly, two qubit gates operating on a pair of non-nearest neighbor qubits require "state swapping," which swaps the quantum state of two qubits. State swapping enables the quantum state of a qubit to be transferred from one qubit to another qubit that is a nearest neighbor qubit, and vice versa, so that the states of the two qubits are swapped. State swapping enables gates to act on non-nearest neighbor qubits, but adds operations to the quantum circuit. For example, a CNOT operation between qubit $Q_{00}$ 202 and qubit $Q_{54}$ 204 requires sixteen swaps along 206-220 in addition to the (nearest neighbor) CNOT gate.

Figure 3:
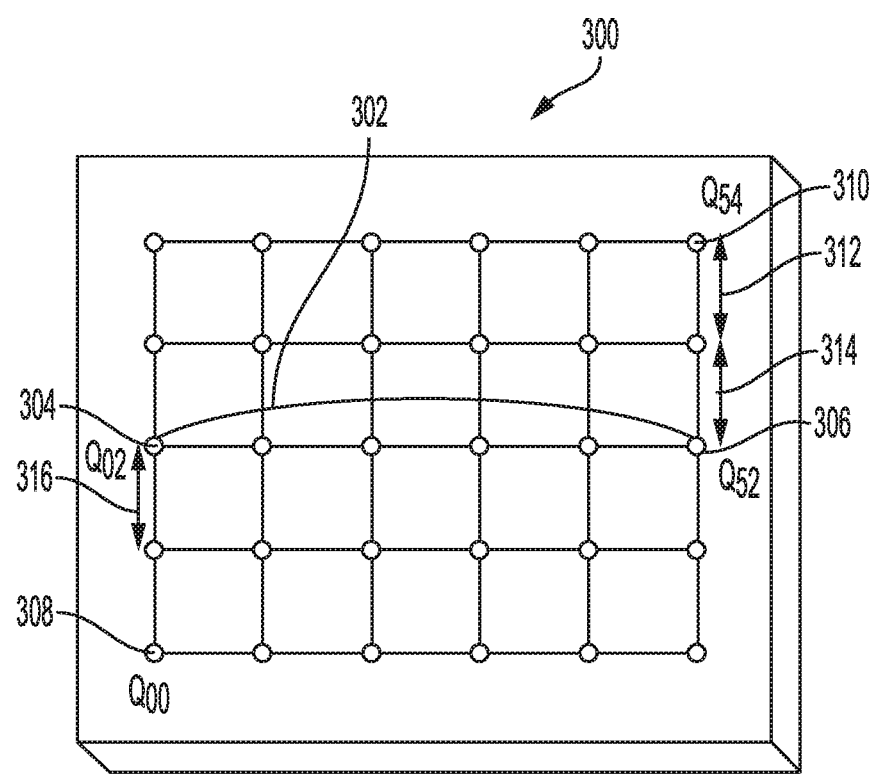
FIG. 3 is a schematic illustration of a quantum processor that includes a long-range connector between qubit $Q_{02}$ and qubit $Q_{52}$ according to an embodiment of the present invention.

FIG. 3 is a schematic illustration of a quantum processor 300 that includes a long-range connector 302 between qubit $Q_{02}$ 304 and qubit $Q_{52}$ 306. A CNOT gate acting on qubit $Q_{00}$ 308 and qubit $Q_{54}$ 310 requires only eight swaps along 312, 314, 302, and 316. The long-range connector 302 thus reduces the number of swap gates required for performing two-qubit operations on non-nearest-neighbor qubits.

Figure 4:
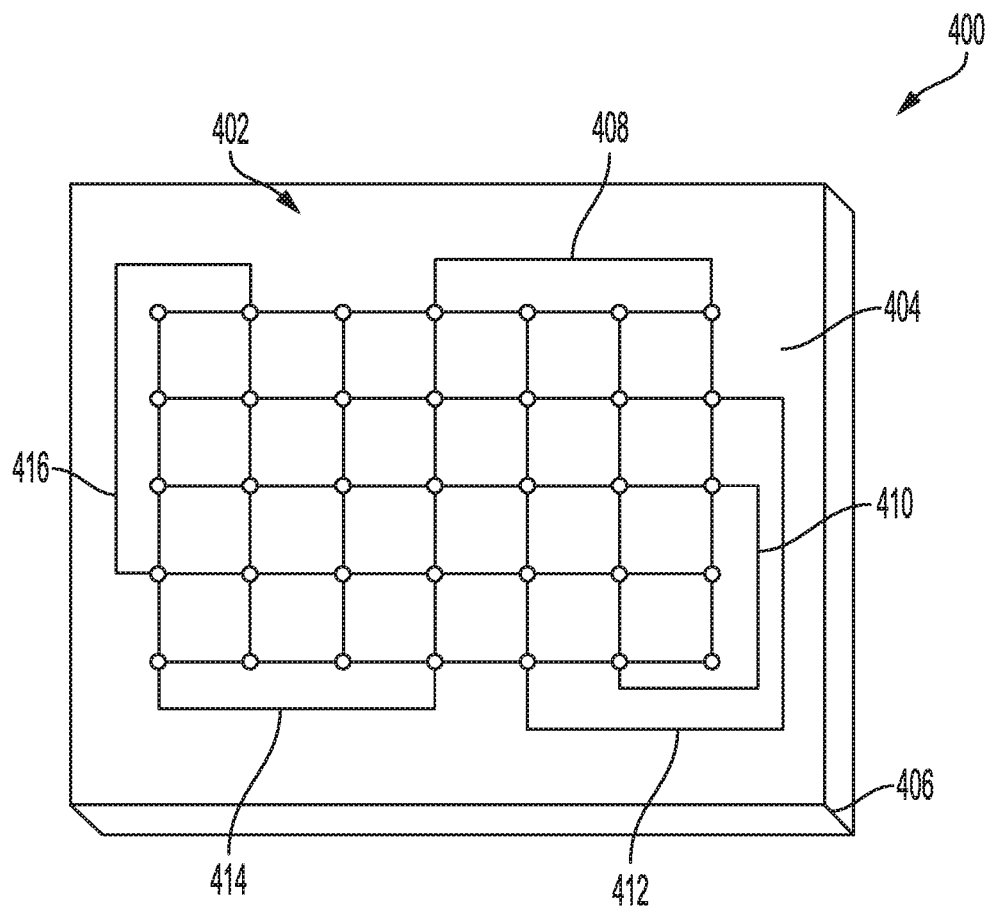
FIG. 4 is a schematic illustration of a quantum processor that includes a long-range connector disposed on a first surface of a substrate of a qubit chip according to an embodiment of the present invention.

According to some embodiments of the present invention, the long-range connector is disposed on the first surface of the substrate of the qubit chip. FIG. 4 is a schematic illustration of a quantum processor 400. The quantum processor 400 includes a qubit chip that includes a plurality of qubits 402 formed on a first surface 404 of a substrate 406 of the qubit chip. The plurality of qubits 402 are arranged in a pattern, wherein nearest-neighbor qubits in the pattern are connected. The quantum processor 400 includes a plurality of long-range connectors 408-416. The long-range connectors 408-416 are disposed on the first surface 404 of the substrate 406 of the qubit chip. The qubit chip according to some embodiments may include a single long-range connector, or a plurality of long-range connectors.

The long-range connectors 408-416 can be disposed on the first surface 404 of the substrate 406 using methods and materials similar to those used to form the connections between the nearest-neighbor qubits in the pattern. Thus, for this configuration, no new processes may be necessary. The quantum processor may require a limited number of long-range connectors, so that the first surface 404 of the substrate 406 does not become overly crowded. The long-range connectors 408-416 could be co-optimized with an algorithm that the quantum processor is configured to perform. However, the embodiments of the invention are not limited to quantum processors that are configured to perform specific algorithms. The long-range connectors 408-416 may connect qubits on the periphery of the pattern, as qubits on the periphery often have unused bus coupling pads. These long-range connectors 408-416 could connect to the same qubit.

Figure 5:
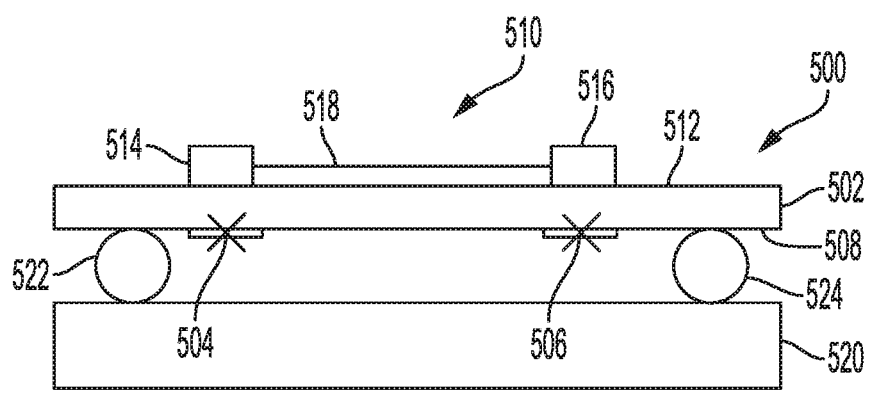
FIG. 5 is a schematic illustration of a qubit chip including two non-nearest neighbor qubits formed on a first surface of a substrate, and a long-range connector disposed on a second surface of the substrate of the qubit chip according to an embodiment of the present invention.

According to some embodiments of the present invention, the long-range connector is disposed on a second surface of the substrate of the qubit chip, the second surface opposing the first surface. Disposing the long-range connector on the second surface frees up space on the first surface, provided that a high Q-factor of the bus can be maintained. 3D integration processing may be used to form the long-range connector on the second surface of the substrate. FIG. 5 is a schematic illustration of a qubit chip 500 including two non-nearest neighbor qubits 504, 506 formed on a first surface 508 of a substrate 502. The qubit chip 500 includes a long-range connector 510 disposed on a second surface 512 of the substrate 502 of the qubit chip 500. The long-range connector 510 connects two non-nearest neighbor qubits 504, 506.

According to some embodiments of the present invention, the long-range connector 510 includes a first coupling pad 514 arranged to align with the first qubit 504, a second coupling pad 516 arranged to align with the second qubit 506, and a bus 518 connecting the first coupling pad 514 to the second coupling pad 516. In operation, the first coupling pad 514 capacitively couples to the first qubit 504 and the second coupling pad 516 capacitively couples to the second qubit 506. As illustrated in FIG. 5, the qubit chip 500 may be bonded to an interposer chip 520 by a plurality of bumps 522, 524. The interposer chip 520 may include readout resonators configured to couple to the qubits 504, 506. Qubits 504 or 506 could have more than one long-range connector coupled to them.

Figure 6:
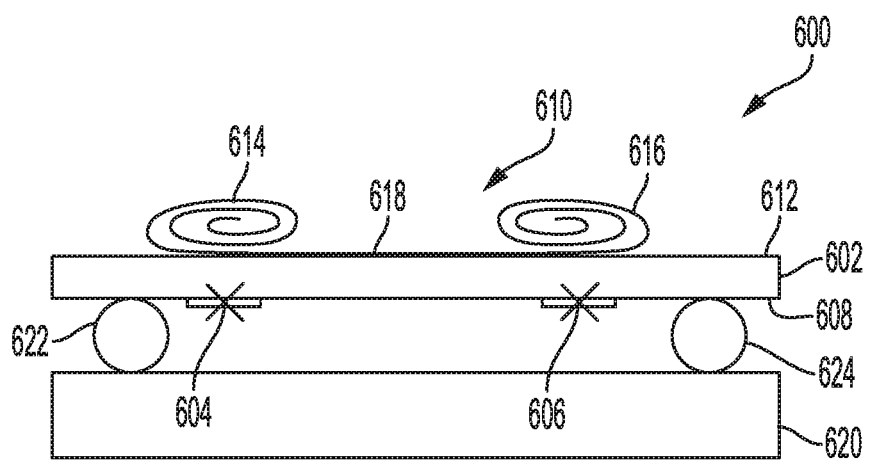
FIG. 6 is a schematic illustration of a qubit chip that includes a long-range connector including two coupling coils according to an embodiment of the present invention.

According to some embodiments of the present invention, the long-range connector is disposed on a second surface of the substrate of the qubit chip, and it includes two coupling coils. FIG. 6 is a schematic illustration of a qubit chip 600 including two non-nearest neighbor qubits 604, 606 formed on a first surface 608 of a substrate 602. The qubit chip 600 includes a long-range connector 610 disposed on a second surface 612 of the substrate 602. The long-range connector 610 includes a first coupling coil 614 arranged to align with the first qubit 604, a second coupling coil 616 arranged to align with the second qubit 606, and a bus 618 connecting the first coupling coil 614 to the second coupling coil 616. In operation, the first coupling coil 614 inductively couples to the first qubit 604 and the second coupling coil 616 inductively couples to the second qubit 606. The long-range connector 610 thus connects the first qubit 604 to the second qubit 606. As illustrated in FIG. 6, the qubit chip 600 may be bonded to an interposer chip 620 by a plurality of bumps 622, 624. The interposer chip 620 may include readout resonators configured to couple to the qubits 604, 606. Qubits 604 or 606 could have more than one long-range connector coupled to them.

Figure 7:
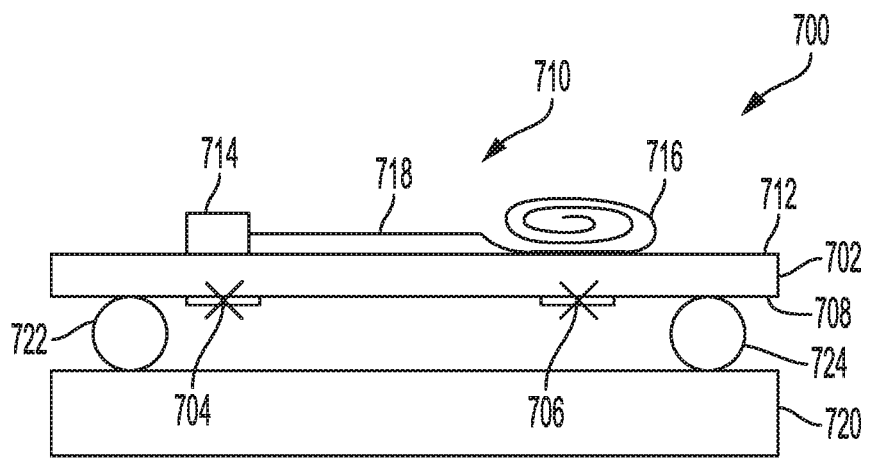
FIG. 7 is a schematic illustration of a qubit chip that includes a long-range connector including a coupling pad and a coupling coil according to an embodiment of the present invention.

According to some embodiments of the present invention, the long-range connector is disposed on a second surface of the substrate of the qubit chip, and it includes a coupling pad and a coupling coil. FIG. 7 is a schematic illustration of a qubit chip 700 including two non-nearest neighbor qubits 704, 706 formed on a first surface 708 of a substrate 702. The qubit chip 700 includes a long-range connector 710 disposed on a second surface 712 of the substrate 702. The long-range connector 710 includes a coupling pad 714 arranged to align with the first qubit 704, a coupling coil 716 arranged to align with the second qubit 706, and a bus 718 connecting the coupling pad 714 to the coupling coil 716. In operation, the coupling pad 714 capacitively couples to the first qubit 704 and the coupling coil 716 inductively couples to the second qubit 706, thereby connecting the first qubit 704 to the second qubit 706. As illustrated in FIG. 7, the qubit chip 700 may be bonded to an interposer chip 720 by a plurality of bumps 722, 724. The interposer chip 720 may include readout resonators configured to couple to the qubits 704, 706. Qubits 704 or 706 could have more than one long-range connector coupled to them.

Figure 8:
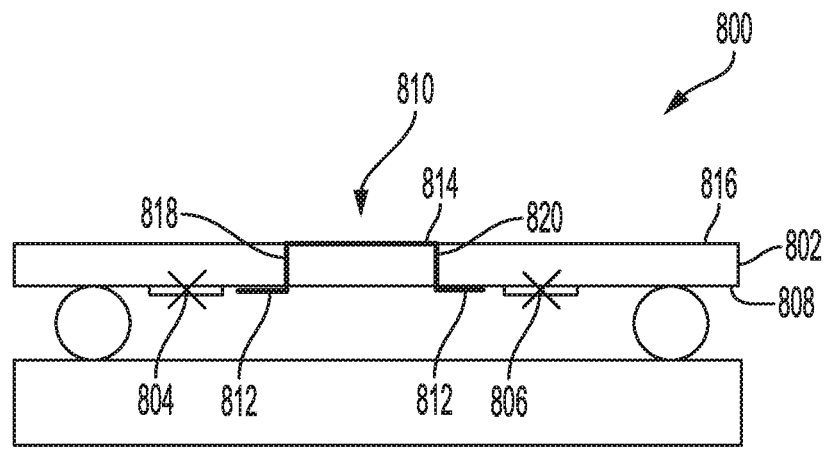
FIG. 8 is a schematic illustration of a qubit chip having a first portion of a long-range connector disposed on a first surface of a substrate of the qubit chip, and a second portion of the long-range connector disposed on a second surface of the substrate according to an embodiment of the present invention.

According to some embodiments of the present invention, a first portion of the long-range connector is disposed on a first surface of a substrate of a qubit chip, and a second portion of the long-range connector is disposed on a second surface of the substrate. FIG. 8 is a schematic illustration of a qubit chip 800 including two non-nearest neighbor qubits 804, 806 formed on a first surface 808 of a substrate 802. The qubit chip 800 includes a long-range connector 810. A first portion 812 of the long-range connector 810 is disposed on the first surface 808 of the substrate 802 of the qubit chip 800. A second portion 814 of the long-range connector 810 is disposed on a second surface 816 of the substrate 802 of the qubit chip 800. The qubit chip 800 includes a through via 818 connecting the first portion 812 to the second portion 814. As shown in FIG. 8, the qubit chip 800 may include a plurality of through vias 818, 820 connecting the first portion 812 to the second portion 814. The vias 818, 820 enable the second portion 814 of the long-range connector 810 to be formed on the second surface 816 of the substrate 802, reducing the amount of space on the first surface 808 that the long-range connector 810 occupies. The vias 818, 820 also enable the second portion 814 of the long-range connector 810 to overlap features formed on the first surface 808 of the substrate 802. Qubits 804 or 806 could have more than one long-range connector coupled to them.

Figure 9:
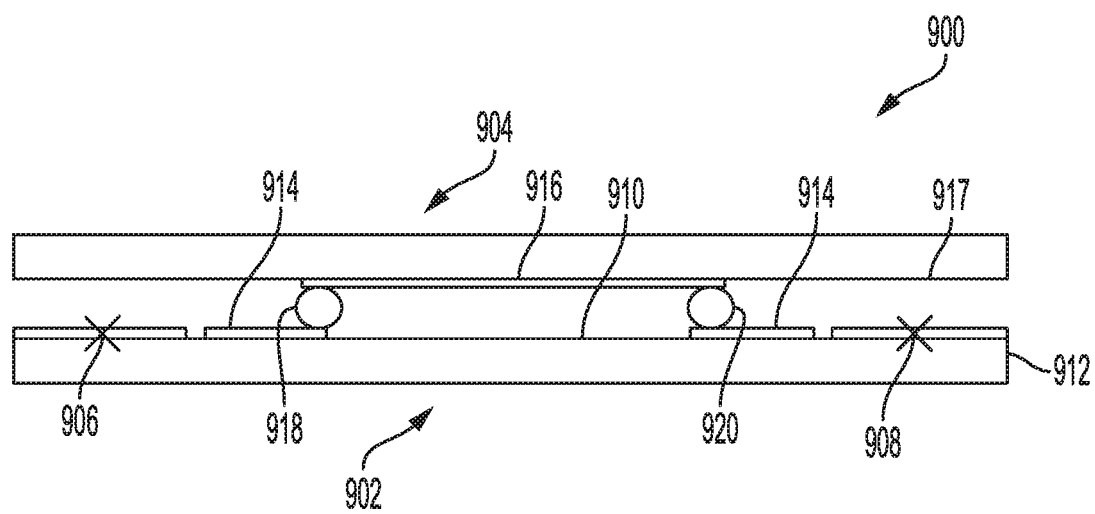
FIG. 9 is a schematic illustration of a quantum processor that includes a qubit chip and an interposer chip according to an embodiment of the present invention.

According to some embodiments of the present invention, the quantum processor includes an interposer chip. FIG. 9 is a schematic illustration of a quantum processor 900 that includes a qubit chip 902 and an interposer chip 904. The qubit chip 902 includes two non-nearest neighbor qubits 906, 908 formed on a first surface 910 of a substrate 912. A first portion 914 of the long-range connector is formed on the first surface 910 of the substrate 912 of the qubit chip 902. A second portion 916 of the long-range connector is formed on a surface 917 of the interposer chip 904. In operation, the qubit chip 902 is bonded to the interposer chip 904 such that the first portion 914 of the long-range connector is bonded to the second portion 916 of the long-range connector. The long-range connector may be enabled by flip-chip technology. For example, solder bumps 918, 920 may connect the first portion 914 of the long-range connector to the second portion 916. The solder bumps 918, 920 may include a superconducting material, for example, elemental superconductors, such as Indium (In) or Tin (Sn), or compound superconductors. The configuration of the quantum processor 900 utilizes space on the surface of the interposer chip 904, which is often under-utilized and may be less crowded than the first surface of the qubit chip. The first portion 914 of the long-range connector may be capacitively coupled to the qubits 906, 908. Qubits 906 or 908 could have more than one long-range connector coupled to them.

Figure 10:
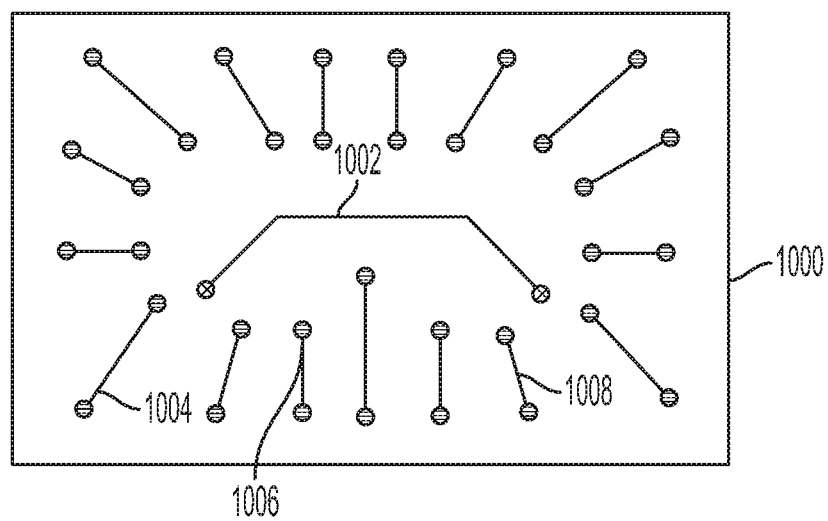
FIG. 10 is a schematic illustration of an interposer chip that includes a long-range connector according to an embodiment of the present invention.

According to some embodiments of the present invention, in addition to the long-rang connector or a portion of the long-range connector, the interposer chip includes a plurality of readout resonators. The readout resonators are configured to couple to the plurality of qubits formed on the first surface of the substrate of the qubit chip. FIG. 10 is a schematic illustration of an interposer chip 1000 that includes a long-range connector (or a portion of a long-range connector) 1002. The interposer chip 1000 also includes a plurality of readout resonators 1004-1008. The readout resonators 1004-1008 are configured to couple to qubits formed on the first surface of the substrate of the qubit chip.

Figure 11:
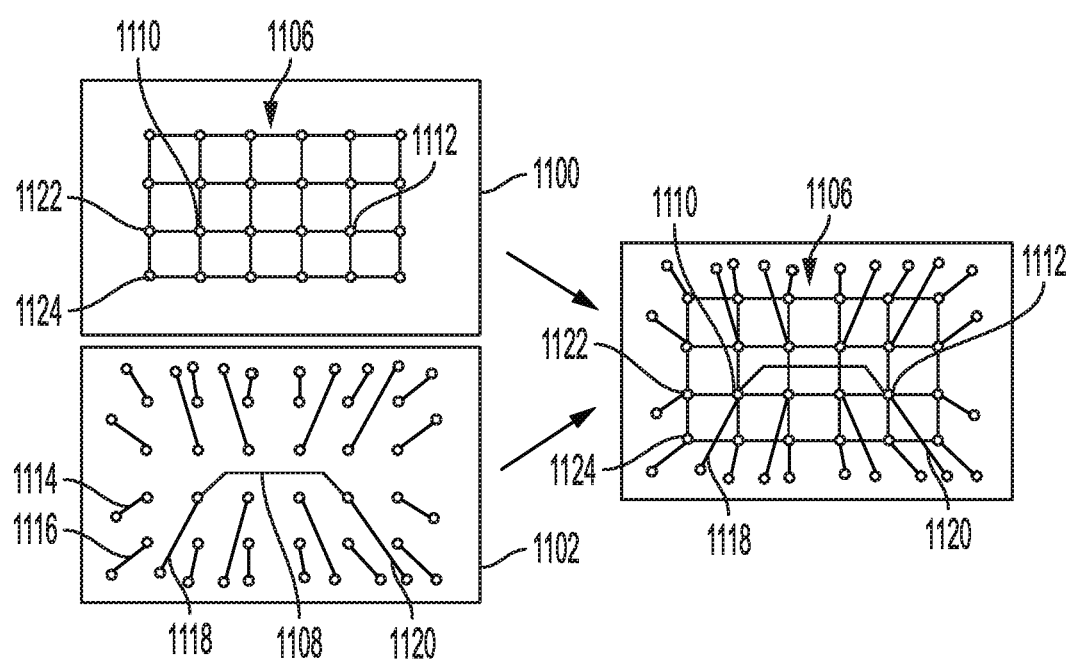
FIG. 11 is a schematic illustration of a qubit chip bonded to an interposer chip according to an embodiment of the present invention.

FIG. 11 is a schematic illustration of a qubit chip 1100 bonded to an interposer chip 1102. The qubit chip 1100 includes a plurality of qubits 1106 arranged in a pattern. The interposer chip 1102 includes a long-range connector 1108. The long-range connector 1108 is configured to connect two non-nearest neighbor qubits 1110, 1112 in the pattern. The interposer chip 1102 also includes a plurality of readout resonators 1114-1120. The readout resonators 1114-1120 are configured to couple to qubits 1122, 1124, 1110, 1112 formed on the qubit chip 1100. The embodiments of the invention are not limited to a particular type of qubit. For example, the embodiments of the combination may include phase, charge, and flux qubits, and variants and hybridizations thereof, for example, transmon qubits, fluxonium qubits, Xmon qubits, capacitively shunted flux qubits (CSFQs), and asymmon qubits.

Figure 12:
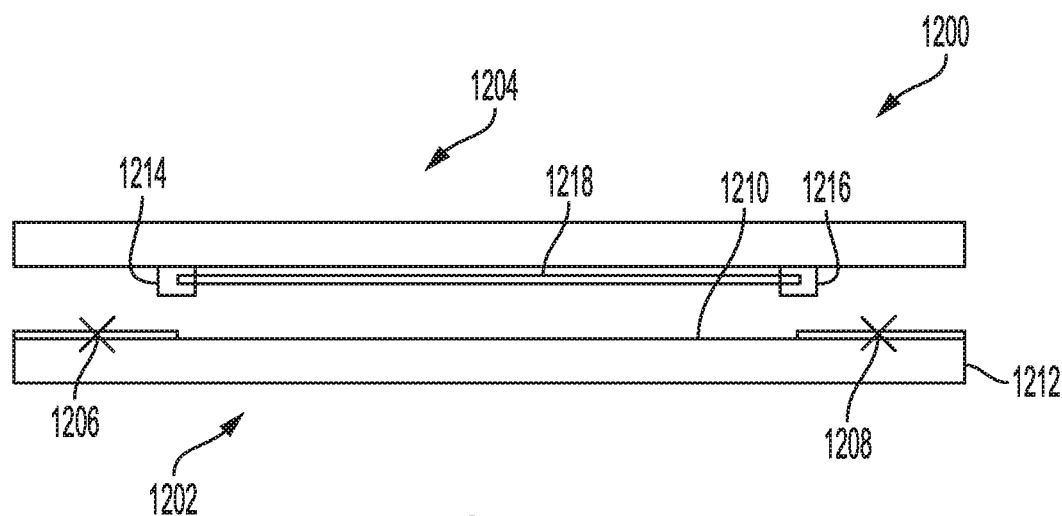
FIG. 12 is a schematic illustration of a quantum processor that includes a qubit chip and an interposer chip, wherein the interposer chip includes a long-range connector that capacitively couples to first and second qubits on the qubit chip according to an embodiment of the present invention.

According to some embodiments of the invention, the interposer chip includes a long-range connector that capacitively couples to first and second qubits on the qubit chip. FIG. 12 is a schematic illustration of a quantum processor 1200 that includes a qubit chip 1202 and an interposer chip 1204. The qubit chip 1202 includes two non-nearest neighbor qubits 1206, 1208 formed on a first surface 1210 of a substrate 1212. The interposer chip 1204 includes a long-range connector that includes a first coupling pad 1214 arranged to align with the first qubit 1206, and a second coupling pad 1216 arranged to align with the second qubit 1208. The long-range connector includes a bus 1218 connecting the first coupling pad 1214 to the second coupling pad 1216. In operation, the qubit chip 1202 is bonded to the interposer chip 1204 such that the first coupling pad 1214 capacitively couples to the first qubit 1206 and the second coupling pad 1216 capacitively couples to the second qubit 1208, thereby connecting the first qubit 1206 to the second qubit 1208. Simulation and design optimization may be employed to alleviate mixing of coupling and readout signals. Qubits 1206 or 1208 could have more than one long-range connector coupled to them.

Figure 13:
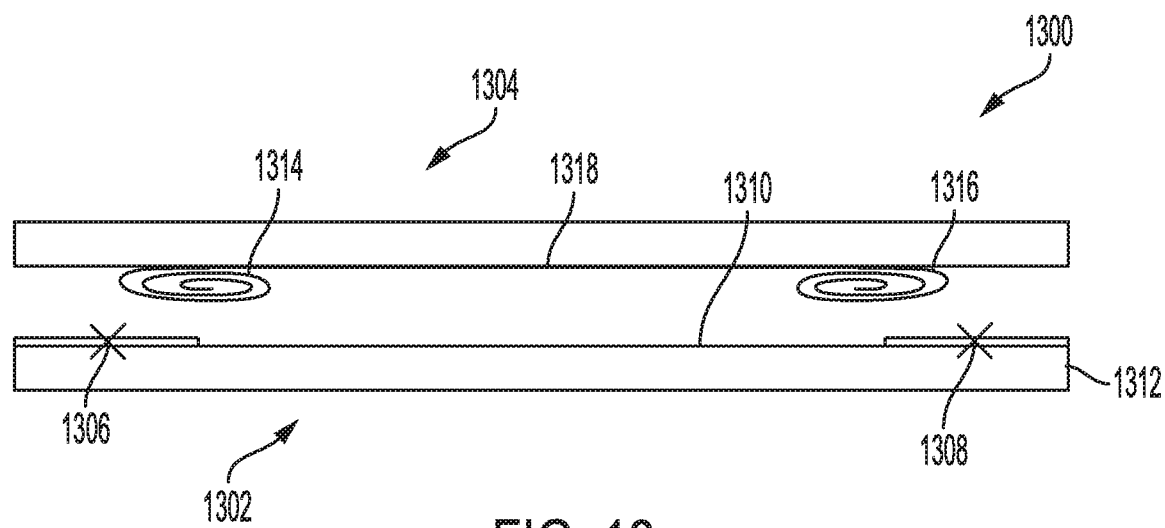
FIG. 13 is a schematic illustration of a quantum processor that includes a qubit chip and an interposer chip, wherein the interposer chip includes a long-range connector that inductively couples to first and second qubits on the qubit chip according to an embodiment of the present invention.

According to some embodiments of the invention, the interposer chip includes a long-range connector that inductively couples to first and second qubits on the qubit chip. FIG. 13 is a schematic illustration of a quantum processor 1300 that includes a qubit chip 1302 and an interposer chip 1304. The qubit chip 1302 includes two non-nearest neighbor qubits 1306, 1308 formed on a first surface 1310 of a substrate 1312. The interposer chip 1304 includes a long-range connector that includes a first coupling coil 1314 arranged to align with the first qubit 1306, and a second coupling coil 1316 arranged to align with the second qubit 1308. The long-range connector includes a bus 1318 connecting the first coupling coil 1314 to the second coupling coil 1316. In operation, the qubit chip 1302 is bonded to the interposer chip 1304 such that the first coupling coil 1314 inductively couples to the first qubit 1306 and the second coupling coil 1316 inductively couples to the second qubit 1308, thereby connecting the first qubit 1306 to the second qubit 1308. Qubits 1306 or 1308 could have more than one long-range connector coupled to them.

Figure 14:
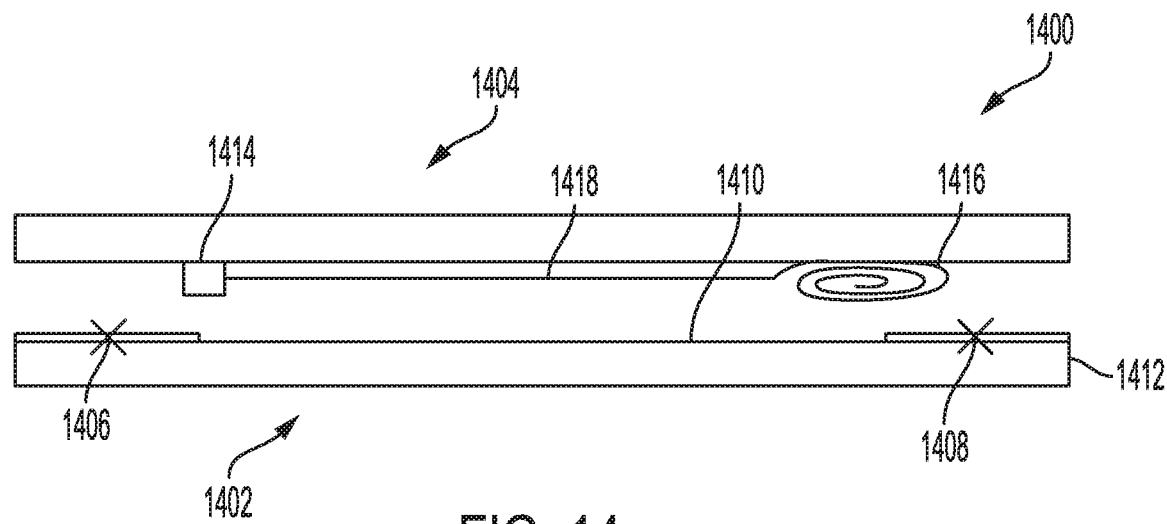
FIG. 14 is a schematic illustration of a quantum processor that includes a qubit chip and an interposer chip, wherein the interposer chip includes a long-range connector that capacitively couples to a first qubit and inductively couples to a second qubit on the qubit chip according to an embodiment of the present invention.

According to some embodiments of the invention, the interposer chip includes a long-range connector that capacitively couples to a first qubit and inductively couples to a second qubit on the qubit chip. FIG. 14 is a schematic illustration of a quantum processor 1400 that includes a qubit chip 1402 and an interposer chip 1404. The qubit chip 1402 includes two non-nearest neighbor qubits 1406, 1408 formed on a first surface 1410 of a substrate 1412. The interposer chip 1404 includes a long-range connector that includes a coupling pad 1414 arranged to align with the first qubit 1406, and a coupling coil 1416 arranged to align with the second qubit 1408. The long-range connector includes a bus 1418 connecting the coupling pad 1414 to the coupling coil 1416. In operation, the qubit chip 1402 is bonded to the interposer chip 1404 such that the coupling pad 1414 capacitively couples to the first qubit 1406 and the coupling coil 1416 inductively couples to the second qubit 1408, thereby connecting the first qubit 1406 to the second qubit 1408. The combination of capacitive and inductive coupling enables qubits to be coupled at different strengths. For example, the coupling pad 1414 may be strongly coupled to the first qubit 1406 by capacitive coupling, while the coupling coil 1416 is weakly coupled to the second qubit 1408 by inductive coupling. Qubits 1406 or 1408 could have more than one long-range connector coupled to them.

The interposer chip according to some embodiments of the invention includes a plurality of readout resonators configured to couple to the plurality of qubits formed on the first surface of the substrate of the qubit chip. For example, the interposer chips schematically illustrated in FIGS. 12-14 may include a plurality of readout resonators in addition to the long-range connector.

According to some embodiments of the invention, an interposer chip includes a substrate, a first coupling portion formed on the substrate, the first coupling portion positioned to align with a first qubit on a qubit chip, a second coupling portion formed on the substrate, the second coupling portion positioned to align with a second qubit on the qubit chip, and a bus formed on the substrate, the bus connecting the first coupling portion to the second coupling portion. The interposer chip is configured to be bonded to the qubit chip such that the first coupling portion couples to the first qubit and the second coupling portion couples to the second qubit. Examples of the interposer chip are schematically illustrated in FIGS. 12-14.

According to some embodiments of the invention, the first and second coupling portions are first and second coupling pads, and the interposer chip is configured to be bonded to the qubit chip such that the first coupling pad capacitively couples to the first qubit and the second coupling pad capacitively couples to the second qubit. An example of this configuration of the interposer chip is schematically illustrated in FIG. 12.

According to some embodiments of the invention, the first and second coupling portions are first and second coupling coils, and the interposer chip is configured to be bonded to the qubit chip such that the first coupling coil inductively couples to the first qubit and the second coupling coil inductively couples to the second qubit. An example of this configuration of the interposer chip is schematically illustrated in FIG. 13.

According to some embodiments of the invention, the first coupling portion is a coupling pad and the second coupling portion is a coupling coil, and the interposer chip is configured to be bonded to the qubit chip such that the coupling pad capacitively couples to the first qubit and the coupling coil inductively couples to the second qubit. An example of this configuration of the interposer chip is schematically illustrated in FIG. 14.

According to some embodiments of the invention, the interposer chip further includes first and second readout resonators formed on the substrate. The first and second readout resonators are configured to couple to the first and second qubits, respectively. FIG. 11 is a schematic illustration of an interposer chip 1102 that includes first and second readout resonators 1118, 1120 configured to couple to the first and second qubits 1110, 1112, respectively.

According to some embodiments of the invention, the first and second qubits connected by the long-range connector are located on a perimeter of the pattern. Alternatively, one or both of the first and second qubits may be located on an interior of the pattern. According to some embodiments, the first qubit and the second qubit are separated by at least three qubits in the pattern. The embodiments of the invention are not limited to a particular pattern of qubits. The pattern of qubits and the configuration of the long-range connector may be chosen for a particular application. For example, if the quantum processor is used to perform an algorithm of depth D, the long-range connector may be configured to jump fewer than D qubits.

Figure 15A:
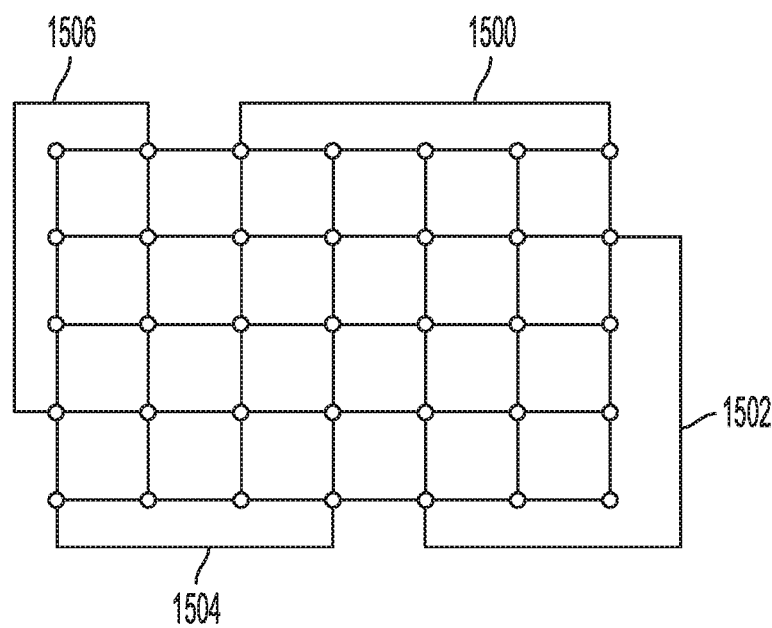
FIGS. 15A-15D are schematic illustrations of various patterns of qubits, and various configurations of long-range connectors, according to some embodiments of the present invention.
Figure 15B:
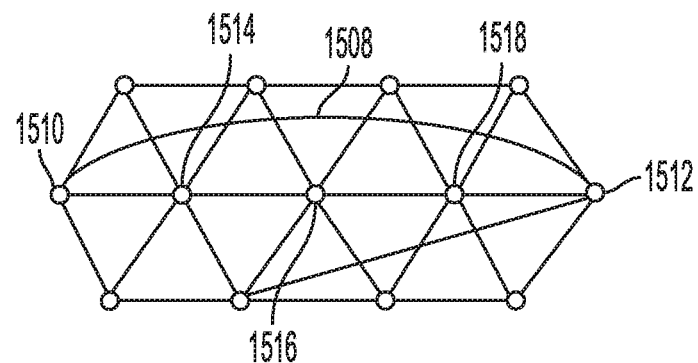
Figure 15C:
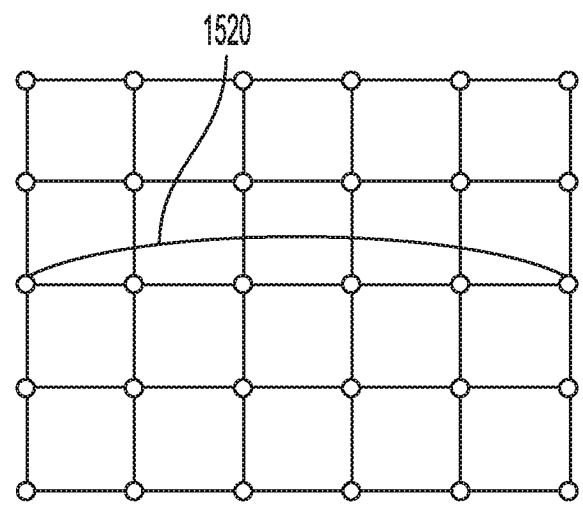
Figure 15D:
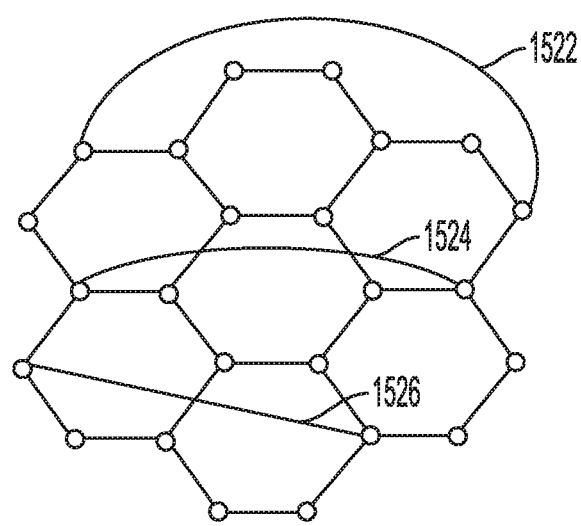

FIGS. 15A-15D are schematic illustrations of various patterns of qubits, and various configurations of long-range connectors, according to some embodiments of the invention. The long-range connectors may be disposed on the qubit chip, on an interposer chip, or on a combination of both. FIG. 15A is a schematic illustration of qubits arranged in a square pattern. The long-range connectors 1500-1506 connect non-nearest neighbor qubits that are located on a perimeter of the pattern. FIG. 15B is a schematic illustration of qubits arranged in a triangular pattern. A long-range connector 1508 connects a first qubit 1510 and a second qubit 1512 that are separated by three qubits 1514-1518 in the pattern. FIG. 15C is a schematic illustration of qubits arranged in a square pattern. A single long-range connector 1520 connects non-nearest neighbor qubits located on a perimeter of the pattern. FIG. 15D is a schematic illustration of qubits arranged in a hexagonal pattern. The long-range connectors 1522-1526 connect non-nearest neighbor qubits separated by at least four qubits in the pattern. The schematic illustrations in FIGS. 15A-15D are provided as non-limiting examples of patterns of qubits and configurations of long-range connectors.

Figure 16:
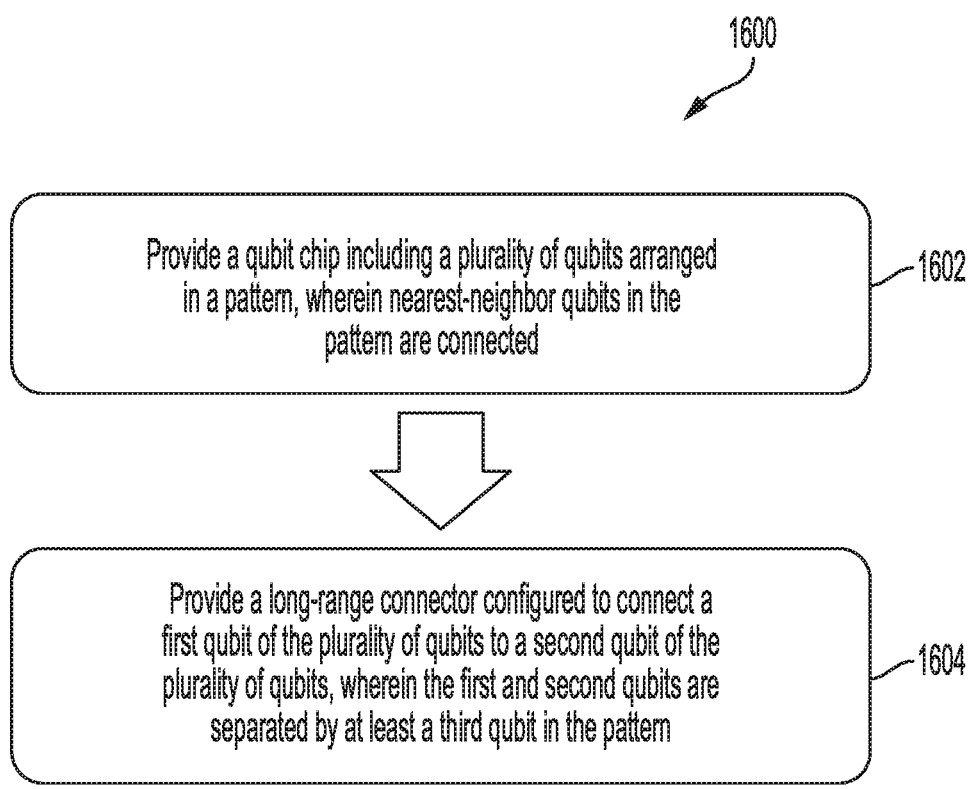
FIG. 16 is a flowchart that illustrates a method to enable long range connectivity of qubits on a qubit chip according to an embodiment of the present invention.

FIG. 16 is a flowchart that illustrates a method 1600 to enable long range connectivity of qubits on a qubit chip according to an embodiment of the present invention. The method 1600 includes providing the qubit chip comprising a plurality of qubits arranged in a pattern, wherein nearest-neighbor qubits in the pattern are connected 1602. The method 1600 includes providing a long-range connector configured to connect a first qubit of the plurality of qubits to a second qubit of the plurality of qubits, wherein the first and second qubits are separated by at least a third qubit in the pattern 1604.

According to some embodiments of the invention, providing the long-range connector includes forming the long-range connector on the qubit chip. According to some embodiments, providing the long-range connector comprises providing an interposer chip. The interposer chip includes a substrate, a first coupling portion formed on the substrate, the first coupling portion positioned to align with the first qubit on the qubit chip, a second coupling portion formed on the substrate, the second coupling portion positioned to align with the second qubit on the qubit chip, and a bus formed on the substrate, the bus connecting the first coupling portion to the second coupling portion. The method 1600 further includes bonding the interposer chip to the qubit chip such that the first coupling portion couples to the first qubit and the second coupling portion couples to the second qubit.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A quantum processor, comprising:
    a qubit chip, the qubit chip comprising:
        a substrate; and
        a plurality of qubits formed on a first surface of the substrate, the plurality of qubits arranged in a pattern, wherein nearest-neighbor qubits in the pattern are connected; and
        a long-range connector configured to couple a first qubit of the plurality of qubits to a second qubit of the plurality of qubits, wherein the first and second qubits are separated by at least a third qubit in the pattern,
    wherein at least a portion of the long-range connector is disposed on a second surface different from said first surface.

2. The quantum processor according to claim 1, wherein the long-range connector reduces a number of swap gates required for performing two-qubit operations on non-nearest-neighbor qubits.

3. The quantum processor according to claim 1, wherein the long-range connector is disposed on the first surface of the substrate of the qubit chip.

4. The quantum processor according to claim 1, wherein the long-range connector is disposed on the second surface, the second surface being a surface of the substrate of the qubit chip, the second surface opposing the first surface.

5. The quantum processor according to claim 4, wherein the long-range connector comprises:
    a first coupling pad arranged to align with the first qubit;
    a second coupling pad arranged to align with the second qubit; and
    a bus connecting the first coupling pad to the second coupling pad,
    wherein, in operation, the first coupling pad capacitively couples to the first qubit and the second coupling pad capacitively couples to the second qubit.

6. The quantum processor according to claim 4, wherein the long-range connector comprises:
    a first coupling coil arranged to align with the first qubit;
    a second coupling coil arranged to align with the second qubit; and
    a bus connecting the first coupling coil to the second coupling coil,
    wherein, in operation, the first coupling coil inductively couples to the first qubit and the second coupling coil inductively couples to the second qubit.

7. The quantum processor according to claim 4, wherein the long-range connector comprises:
    a coupling pad arranged to align with the first qubit;
    a coupling coil arranged to align with the second qubit; and
    a bus connecting the coupling pad to the coupling coil,
    wherein, in operation, the coupling pad capacitively couples to the first qubit and the coupling coil inductively couples to the second qubit.

8. The quantum processor according to claim 1,
    wherein a first portion of the long-range connector is disposed on the first surface of the substrate of the qubit chip,
    wherein a second portion of the long-range connector is disposed on the second surface the second surface being a surface of the substrate of the qubit chip, the second surface opposing the first surface, and
    wherein the qubit chip comprises a through via connecting the first portion to the second portion.

9. The quantum processor according to claim 1, further comprising an interposer chip,
    wherein a first portion of the long-range connector is formed on the first surface of the substrate of the qubit chip,
    wherein a second portion of the long-range connector is formed on the second surface the second surface being a surface of the interposer chip, and
    wherein, in operation, the qubit chip is bonded to the interposer chip such that the first portion of the long-range connector is bonded to the second portion of the long-range connector.

10. The quantum processor according to claim 9, wherein the interposer chip further comprises a plurality of readout resonators configured to couple to the plurality of qubits formed on the first surface of the substrate of the qubit chip.

11. The quantum processor according to claim 1, further comprising an interposer chip, wherein the long-range connector is formed on the interposer chip, the long-range connector comprising:
    a first coupling pad arranged to align with the first qubit;
    a second coupling pad arranged to align with the second qubit; and
    a bus connecting the first coupling pad to the second coupling pad,
    wherein, in operation, the qubit chip is bonded to the interposer chip such that the first coupling pad capacitively couples to the first qubit and the second coupling pad capacitively couples to the second qubit.

12. The quantum processor according to claim 11, wherein the interposer chip further comprises a plurality of readout resonators configured to couple to the plurality of qubits formed on the first surface of the substrate of the qubit chip.

13. The quantum processor according to claim 1, further comprising an interposer chip, wherein the long-range connector is formed on the interposer chip, the long-range connector comprising:
    a first coupling coil arranged to align with the first qubit;
    a second coupling coil arranged to align with the second qubit; and
    a bus connecting the first coupling coil to the second coupling coil,
    wherein, in operation, the qubit chip is bonded to the interposer chip such that the first coupling coil inductively couples to the first qubit and the second coupling coil inductively couples to the second qubit.

14. The quantum processor according to claim 1, further comprising an interposer chip, wherein the long-range connector is formed on the interposer chip, the long-range connector comprising:
   a coupling pad arranged to align with the first qubit;
   a coupling coil arranged to align with the second qubit; and
   a bus connecting the coupling pad to the coupling coil,
   wherein, in operation, the qubit chip is bonded to the interposer chip such that the coupling pad capacitively couples to the first qubit and the coupling coil inductively couples to the second qubit.

15. The quantum processor according to claim 1, wherein the first qubit and the second qubit are located on a perimeter of the pattern.

16. The quantum processor according to claim 1, wherein the first qubit and the second qubit are separated by at least three qubits in the pattern.

17. An interposer chip, comprising:
   a substrate;
   a first coupling portion formed on the substrate, the first coupling portion positioned to align with a first qubit on a qubit chip;
   a second coupling portion formed on the substrate, the second coupling portion positioned to align with a second qubit on the qubit chip; and
   a bus formed on the substrate, the bus connecting the first coupling portion to the second coupling portion,
   wherein the first qubit and the second qubit are separated by at least a third qubit,
   wherein the interposer chip is configured to be bonded to the qubit chip such that the first coupling portion couples to the first qubit and the second coupling portion couples to the second qubit.

18. The interposer chip according to claim 17, wherein the first and second coupling portions are first and second coupling pads, and
   wherein the interposer chip is configured to be bonded to the qubit chip such that the first coupling pad capacitively couples to the first qubit and the second coupling pad capacitively couples to the second qubit.

19. The interposer chip according to claim 17, wherein the first and second coupling portions are first and second coupling coils, and
   wherein the interposer chip is configured to be bonded to the qubit chip such that the first coupling coil inductively couples to the first qubit and the second coupling coil inductively couples to the second qubit.

20. The interposer chip according to claim 17, wherein the first coupling portion is a coupling pad and the second coupling portion is a coupling coil, and
   wherein the interposer chip is configured to be bonded to the qubit chip such that the coupling pad capacitively couples to the first qubit and the coupling coil inductively couples to the second qubit.

21. The interposer chip according to claim 17, further comprising first and second readout resonators formed on the substrate, the first and second readout resonators configured to couple to the first and second qubits, respectively.

22. A method to enable long range connectivity of qubits on a qubit chip, comprising:
   forming on a first surface of a substrate of the qubit chip a plurality of qubits arranged in a pattern, wherein nearest-neighbor qubits in the pattern are connected;
   coupling a first qubit of the plurality of qubits to a second qubit of the plurality of qubits with a long-range connector, wherein the first and second qubits are separated by at least a third qubit in the pattern; and
   disposing at least a portion of the long-range connector on a second surface different from said first surface.

23. The method according to claim 22, further comprising forming the long-range connector on the qubit chip.

24. The method according to claim 22, further comprising:
   providing an interposer chip, the interposer chip comprising:
      a substrate;
      a first coupling portion formed on the substrate, the first coupling portion positioned to align with the first qubit on the qubit chip;
      a second coupling portion formed on the substrate, the second coupling portion positioned to align with the second qubit on the qubit chip; and
      a bus formed on the substrate, the bus connecting the first coupling portion to the second coupling portion; and
   bonding the interposer chip to the qubit chip such that the first coupling portion couples to the first qubit and the second coupling portion couples to the second qubit.

* * * * *